United States Patent [19]
Mouchot et al.

[11] Patent Number: 5,523,687
[45] Date of Patent: Jun. 4, 1996

[54] MAGNETIC FLUX GUIDE HAVING TONGUES AND MAGNETORESISTIVE TRANSDUCER INCORPORATING SAID GUIDE

[75] Inventors: Jean Mouchot, Grenoble; Jean-Marc Fedeli, Beaucroissant, both of France

[73] Assignee: Commissariat a l'Energie Atomique, Paris, France

[21] Appl. No.: 295,530

[22] Filed: Aug. 24, 1994

[30] Foreign Application Priority Data

Sep. 2, 1993 [FR] France ................................ 93 10459

[51] Int. Cl.⁶ .................................................. G01R 33/06
[52] U.S. Cl. ........................ 324/252; 324/360; 360/113; 338/32 R
[58] Field of Search ............................. 324/207.21, 252, 324/260, 235, 244, 251; 338/32 R, 32 H; 327/510; 360/113

[56] References Cited

U.S. PATENT DOCUMENTS

| 4,587,509 | 5/1986 | Pitt et al. ................................ 338/32 R |
| 4,791,365 | 12/1988 | Johannes et al. ......................... 324/252 |
| 5,119,025 | 6/1992 | Smith et al. .............................. 324/252 |
| 5,260,653 | 11/1993 | Smith et al. .............................. 324/252 |

FOREIGN PATENT DOCUMENTS

| 0534791 | 3/1993 | European Pat. Off. . |
| 0560350 | 9/1993 | European Pat. Off. ................. 324/252 |
| 2169434 | 7/1986 | United Kingdom . |
| WO92/01945 | 2/1992 | WIPO . |

OTHER PUBLICATIONS

*Magnetoresistance of Multilayers*—Yamamoto et al., IEEE Translation Journal on Magnetics In Japan, vol. 7, No. 9, Sep. 1992.
*Oscillations In Giant Magnetoresistance and Antiferromagnetic Coupling in $[Ni_{81}Fe_{19}/Cu]_N$ Multilayers*—Parkin, Applied Phys. Lett. 60 (4), Jan. 27, 1992.
*Giant Magnetoresistance in Ni–Fe/Cu Multilayers Formed by Ion Beam Sputtering*—Nakatani et al., IEEE Transactions on Magnetics, vol. 28, No. 5, Sep. 1992.
*Magnetoresistive Properties and Thermal Stability of Ni–Fe/Ag Multilayers*—Rodmacq et al., Journal of Magnetism and Magnetic Materials, 118 (1993) L11–L16 North–Holand.

Primary Examiner—Sandra L. O'Shea
Assistant Examiner—Jay M. Patidar
Attorney, Agent, or Firm—Pearne, Gordon, McCoy & Granger

[57] ABSTRACT

Magnetic flux guide having tongues and magnetoresistive transducer incorporating said guide. A transducer is provided which includes a magnetic flux guide having first and second parts longitudinally separated by a head gap and a magnetoresistive bar positioned facing and along the head gap. The first and second guide parts are provided on their edges contiguous with the head gap respectively with a first and second series of tongues separated by spacers. The tongues of the first part extend into the spaces of the second part and vice versa.

14 Claims, 4 Drawing Sheets

MAGNETIC FLUX GUIDE HAVING TONGUES AND MAGNETORESISTIVE TRANSDUCER INCORPORATING SAID GUIDE

BACKGROUND OF THE INVENTION

The present invention relates to a magnetic flux guide and to a magnetoresistive transducer incorporating the flux guide and having two parts longitudinally separated by a head gap, as well as a magnetoresistive bar positioned facing the head gap. This transducer is more particularly intended for producing heads for reading and/or writing informations recorded in magnetic form on a random support such as a hard disk, tape, floppy disk, ticket, card, etc.

The transducer can be used for the detection and location of weak magnetic fields such as the geomagnetic field and the leaking of weak magnetic fields, e.g. associated with the presence of cracks in metallic systems.

Magnetoresistive components are generally in the form of a small magnetoresistive bar, whose ends are connected to current leads in order to bring about a current flow within the bar. In the presence of an external magnetic field, the magnetization M of the resistive bar is differently oriented so as to have the effect of modifying the resistivity of the material. A variation of the voltage then occurs at the terminals of the bar and the measurement of this voltage variation represents the value of the external magnetic field. It can also be representative of its direction.

Thus, by measuring the resistance of the bar it is possible to measure a magnetic field and conversely measure an electrical resistance by measuring a magnetic field.

The most modern magnetic transducers make use of magnetoresistive materials deposited in thin film form on an appropriate substrate. These films are etched in accordance with photolithographic processes in order to give them the shape of a bar.

The magnetic saturation field $H_s$ is defined as being the magnetic field applied to the magnetoresistive component and above which the intrinsic electrical resistivity $\rho$ of the component virtually no longer varies. The following relationship is defined:

$$\frac{\Delta\rho}{\rho} = \frac{[\rho(H=0) - \rho(H=Hs)]}{\rho(H=0)}$$

in which H represents the value of the external magnetic field to be measured: $\rho(H=0)$ being the resistivity of the zero field magnetoresistive component and $\rho(H=Hs)$ its resistivity when the component is in the presence of a magnetic field equal to the saturation field. In addition, $\Delta\rho/\rho=\Delta R/R$, with R representing the resistance of the magnetoresistive component.

The sensitivity $\propto$ of the magnetoresistive structure and therefore that of a magnetoresistive effect transducer are defined by the variation of the magnetoresistance $\Delta R/R$ obtained by applying a unitary external magnetic field and it satisfies the relation:

$$\propto = (\partial(\Delta R/R)/\partial H(_{H<Hs}.$$

The shape of a magnetoresistive component or rather its dimensions influence the orientation of its magnetization. Thus, in the case of a thin magnetic film, the magnetization tends to be aligned in the plane of the film. Moreover, in the case of a long bar, the magnetization is generally oriented in accordance with said length. This amounts to a search for a minimum magnetic energy.

For a given magnetization direction, in the material appears a magnetic field known as the demagnetizing field $H_d$ or the form anisotropy field oriented in the direction opposite to that of the magnetization. The intensity of the demagnetizing field is a function of the geometry of the material in question and the direction taken by the magnetization within it.

FIG. 1 diagrammatically shows a magnetic bar having an elliptical section in order to illustrate the components of this demagnetizing field.

The values of the demagnetizing field coefficients are designated respectively $N_X$, $N_Y$ and $N_Z$ in accordance with the directions X, Y and Z of an orthonormal coordinate OXYZ. When the magnetization M is parallel to the direction X, the demagnetizing field proves the relation $H_d = N_X \cdot M$.

For a magnetoresistive bar of elliptical section assumed to be infinitely long and aligned in accordance with the direction X and having a thickness e in the direction Z and a height h in the direction Y, the following relations are proved: $N_X=0$, $N_Y=e/(h+e)$, $N_Z=h/(h+e)$.

In the case of a bar having a rectangular section, whose thickness e is small compared with its height h, which is itself small compared with its length L, a first approximation consists of considering that: $N_X=0$, $N_Y=e/h$, $N_Z=1$.

Thus, an external magnetic field H applied in the direction Y will be reduced within the magnetoresistive component by the demagnetizing field $H_d$ approximately equal in the latter case to (e/H)M, whereas said same external magnetic field applied in the direction X will not be reduced.

It should be noted that this approach no longer strictly applies as soon as the length of the component is comparable to its height or width. Thus, the demagnetizing field is liable to increase the value of the saturation field Hs and therefore decrease the sensitivity of the transducer.

Hitherto the magnetoresistive materials used for producing magnetic transducers were monolithic materials of the ferromagnetic type. They were mainly compounds based on iron and nickel ($Fe_{19}Ni_{81}$, $Fe_{20}Ni_{80}$) and compounds based on iron, nickel and cobalt ($Fe_{15}Ni_{65}Co_{20}$, $Fe_5Ni_{80}Co_{15}$, . . . ).

At present, new magnetoresistive materials are available. They consist of metallic multilayer magnetic structures (MMMS) constituted by a stack of magnetic layers separated by non-magnetic metallic layers having a thickness such that there is an antiferromagnetic coupling between the magnetic layers.

The investigated metallic multilayer magnetic structures vary. They are constituted by metals chosen from among cobalt, iron, nickel, alloys of iron and nickel, copper, chromium, silver, gold, molybdenum, ruthenium and manganese, as described in document (1) by H. Yamamoto and T. Shinjo (IEEE Translation Journal on Magnetics in Japan, vol. 7, no. 9, September 1992, "Magnetoresistance of multilayers", pp 674–684).

The MMMS's hitherto having the largest number of necessary properties (significant magnetoresistive effect, low saturation field, low coercivity, good annealing resistance) are constituted by FeNi layers separated by copper layers, as described in document (2) by S. S. P. Parkin ("Oscillations in giant magnetoresistance and antiferromagnetic coupling in $[Ni_{81}Fe_{19}/Cu]_N$ multilayers", LLAppl. Phys. Lett. 60, No. 4, January 1992, pp 512–514) and document (3) by R. Nakatani et al (IEEE Transactions on Magnetics, vol. 28, No. 5, September 1992, "Giant magnetoresistance in Ni—Fe/Cu multi-layers formed by ion beam sputtering", p 2668–2670) or FeNi films separated by silver layers, as described in document (4) by B. Rodmacq et al, (Journal of Magnetism and Magnetic materials 118, 1993, pp L11–L16, "Magnetoresistive properties and thermal stability of Ni—Fe/Ag multilayers").

These new materials have the property of being highly magnetoresistive, i.e. having a ratio $\Delta\rho/\rho$ from 10 to 20% and low saturation magnetic fields, i.e. below 40 kA/m.

In MMMS's the magnetoresistive effect corresponds to the rotation of magnetizations of each of the magnetic layers accompanied by a reduction in the electrical resistance during the application of an external magnetic field. In this case the saturation field Hs corresponds to the external magnetic field which it is necessary to apply in order to orient, in the same direction and sense, the magnetization of each of the different magnetic layers.

In the case of the ferromagnetic materials used in monolithic magnetoresistances, the resistance varies with the angle formed by the direction of the current density traversing the component and the magnetization direction in said material. The resistance is lowest when said angle is equal to $\pi/2$. Therefore it is not of interest in this case to apply the external magnetic field to be measured in any random direction, but perpendicular to the length of the magnetoresistive component. Conversely, parallel to the length of the bar, there is no magnetoresistive effect within monolithic ferromagnetic materials.

In modern MMMS structures, the variation of the resistivity and therefore the resistance is virtually independent of the angle formed between the direction of the field present within the magnetoresistive component and the direction of the current flowing through the magnetoresistive component.

However, this field is equal to the difference between the demagnetizing field $H_d$ and the external magnetic field to be measured H due to the fact that the shape and size of the MMMS's are such that, from the magnetic standpoint, they are generally anisotropic. The demagnetizing field coefficients are not identical in all directions of the component, its sensitivity varying with the direction of the magnetic field to be measured, as soon as the latter has an anisotropy of form.

The object of the invention is to produce a very sensitive transducer having a flux guide and making it possible to be free of the effects linked with the anisotropy of form (parallelepipedic), the magnetoresistive structure being used in the transverse mode.

SUMMARY OF THE INVENTION

According to the invention, the first and second parts of the guide are provided on their edges contiguous with the head gap respectively with a first and a second series of tongues separated by spaces, the tongues of the first part extending into the spaces between the tongues of the second part and vice versa. For application to the transducer, the magnetoresistive bar has a magnetoresistive effect when the external magnetic field to be measured has the same direction as the length of the bar.

The lines of the field applied, which were initially channelled by massive or solid parts of the flux guide have a direction change in the vicinity of the head gap as a result of the tongues. The direction is changed so as to orient the lines in the easy magnetization direction of the magnetoresistive bar. As has been explained hereinbefore, the direction is in the length direction of the bar in which the demagnetizing field is particularly weak.

As the saturation field Hs is only slightly affected by the demagnetizing field, it is virtually equivalent to the saturation field of the "massive" material.

In order to increase the effectiveness of the deviation of the lines of the field applied, the head gap is advantageously of smaller size between the lateral parts of the tongues than between the front parts and the edge of the part of the guide respectively facing the tongues.

The bar positioned facing the head gap is advantageously at least partly superimposed on the tongues and its length is at least equal to the flux guide length.

The actual bar is involved in the deviation of the field lines to the extent that being magnetically permeable it attracts to it the field lines.

By acting on the shape of the tongues, their dimensions and on the dimensions of the head gap, it is possible to perfectly adapt the deviation of the field lines to the shape, nature and/or arrangement of the chosen magnetoresistive bar. Effectively, as a function of the varying magnetic permeability of the bar, as well as the distance (in a direction perpendicular to the surface) separating it from the guide, the field lines will be more or less easily attracted by the bar.

When the latter does not adequately attract the field lines in the direction of its length, the shape of the tongues is adjusted so as to obtain a guide bringing about a greater deflection of the field lines.

Thus, several different tongue shapes can be suitable. Relatively simple shapes such as a rectangular or trapezoidal shape in a plane parallel to the bar surface are particularly appropriate. In addition, the edges of the guides facing the bar have a curvature between two of their tongues.

The distance $\phi$ separating the front part of the tongues from the edge of the part of the guide respectively facing the tongues can e.g. vary continuously with a maximum value in a direction parallel to the tongues.

According to another feature of the invention, the magnetoresistive bar and/or flux guide are in thin film form. Advantageously, the bar has a metallic multilayer magnetic structure.

Thus, the magnetoresistive bar is formed from a stack of magnetic material layers separated by non-magnetic material layers. The magnetic materials can be chosen from those referred to hereinbefore. Preference is given to the use of a magnetic material consisting of an alloy of iron, nickel and cobalt (FeNiCo) or an alloy of iron and nickel (FeNi). The non-magnetic material is advantageously copper or silver. The bar e.g. has a stack of 20 two-layers with a total thickness of approximately 0.05 µm.

The flux guide is made from a soft magnetic material e.g. chosen from among alloys based on iron and nickel, or iron, aluminium and silicon.

In a particularly interesting manner, the guide also has a metallic multilayer structure, which for certain of these structures give it a strong magnetic permeability in weak fields, a low magnetic hysteresis and a low magnetic anisotropy.

The flux guides and bar are produced on a non-conductive and non-magnetic substrate. The term non-conductive substrate is understood to mean an insulating or semiconductor substrate.

Among the generally used substrates, reference can be made to amorphous glass and silicon or organic materials such as a polyimide sold under the registered trademark Kapton.

Moreover, a magnetically and electrically insulating material, e.g. silica or silicon nitride layer is previously provided in order to separate the guide from the leads and also from the bar.

In order to improve the crystalline quality of the multilayer structure or structures and consequently the sought magnetoresistive effect, a fine iron or copper attachment film can be e.g. deposited beforehand on the substrate.

According to a variant, it is possible to firstly form the flux guide by the deposition of the soft material or the multilayer structure, followed by etching to the desired shape, directly on the substrate, followed by the deposition of the magnetically and electrically insulating layer and optionally the thin metallic attachment layer, followed by the formation of the magnetoresistive bar by the deposition of a magnetoresistive material, which is then etched to form the leads.

In a second variant, the bar is formed on the substrate, followed by the electrically and magnetically insulating layer and finally the flux guide.

In general terms, the deposits of layers can take place by cathodic sputtering, vacuum evaporation, or molecular beam epitaxy. The etching operations are carried out by ionic machining or chemical etching.

BRIEF DESCRIPTION OF THE DRAWINGS

The invention is described in greater detail hereinafter relative to non-limitative embodiments and the attached drawings, wherein show.

DETAILED DESCRIPTION OF THE PREFERRED EMBODIMENT

Figure 1:
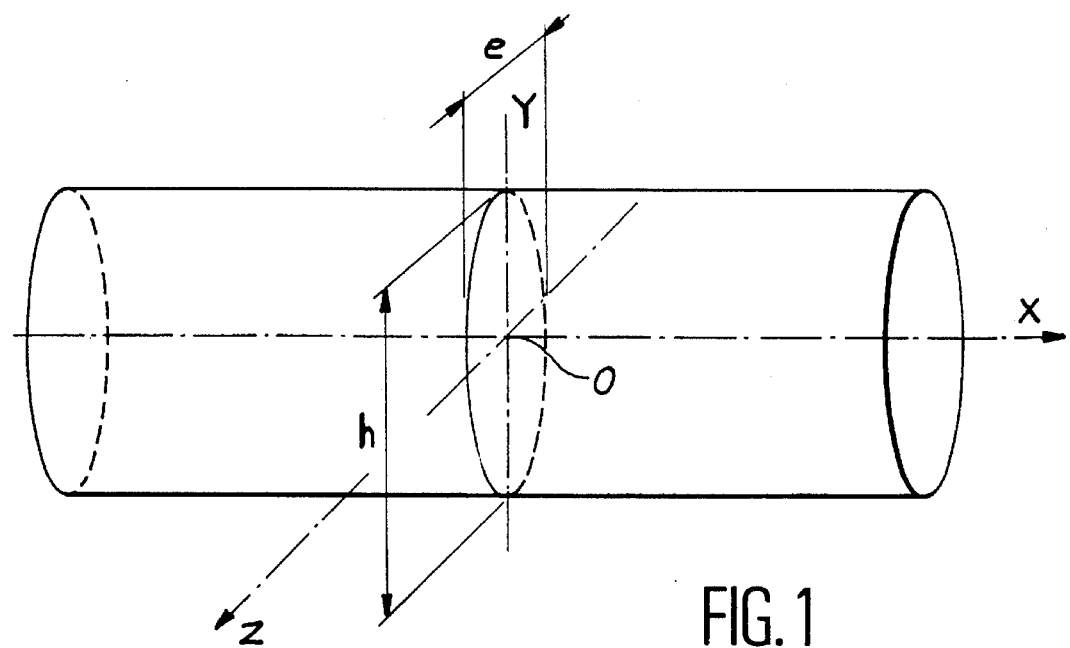
FIG. 1, already described, diagrammatically a magnetoresistive bar having an elliptical section illustrating the demagnetizing fields.
Figure 2:
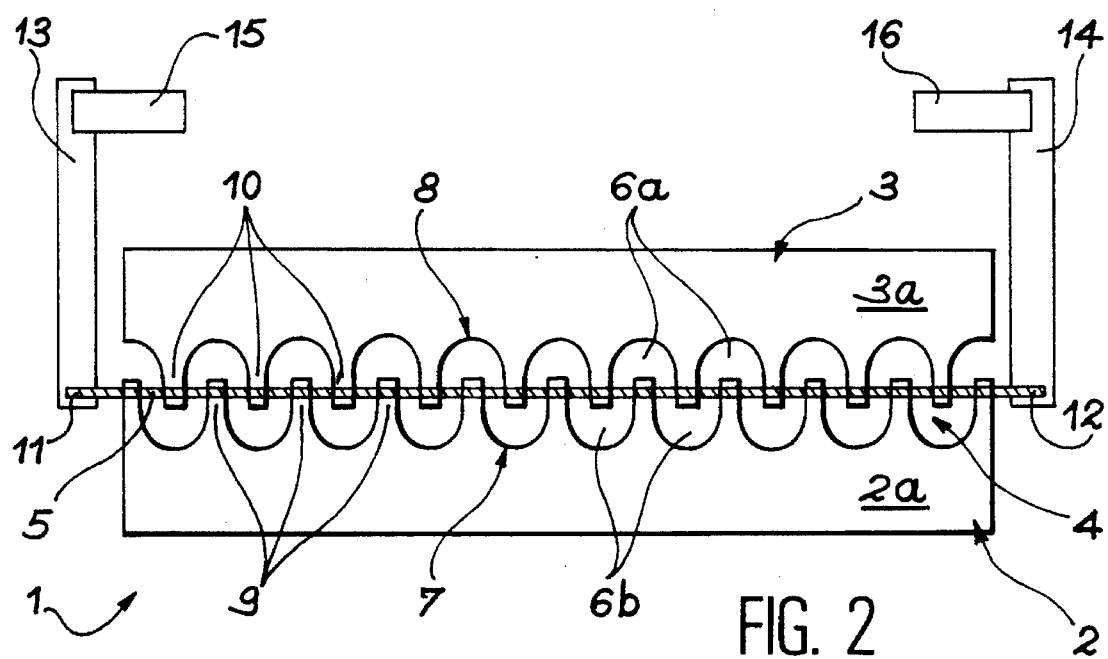
FIG. 2 diagrammatically and in plan view a magnetoresistive transducer according to the invention.

As can be seen in FIG. 2, the transducer according to the invention comprises a flux guide 1 having first and second parts 2, 3 longitudinally separated by a head gap 4 and a magnetoresistive bar 5 facing and along said gap 4.

The first and second parts 2, 3 of the guide are provided on their edges 7, 8 of the solid part 2a, 3a and contiguous with the head gap 4 respectively with a first and a second series of tongues 9, 10 separated by spaces 6a, 6b, the tongues 9 of the first part 2 extending into the spaces 6a of the second part 3, while the tongues 10 of the second part 3 extend into the spaces 6b of the first part 2. The ends 11, 12 of the magnetoresistive bar 5 are connected by means of leads 13, 14 to power points 15, 16.

The shape of the flux guide 1 permits an optimum deviation of the lines of the magnetic field to be detected in order to concentrate them in the magnetoresistive bar 5.

Figure 3:
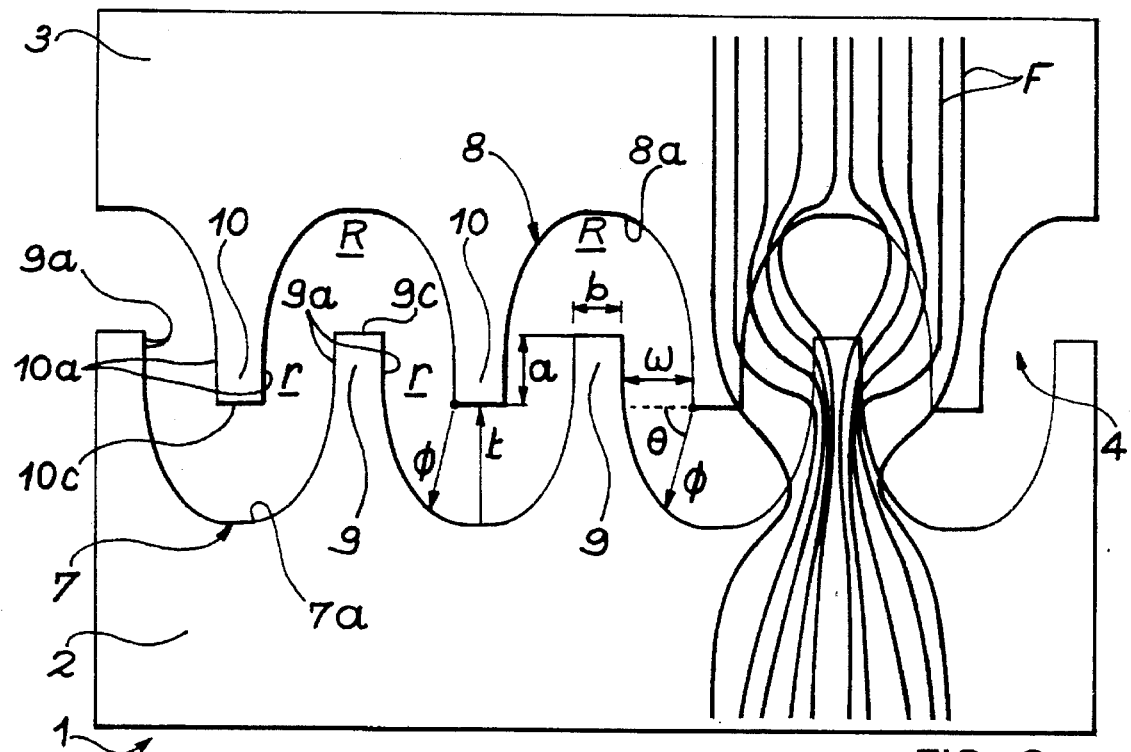
FIG. 3 partially and on a larger scale plan view, a first variant of the flux guide.

As shown in FIG. 3, the field lines F pass from a tongue 10 to a facing tongue 9. In order to significantly deviate these field lines F, it is desirable for the head gap 4 to have a reduced size in the regions r positioned between the lateral sides 9a, 10a respectively of two consecutive tongues than in the regions R between the front parts 9c, 10c of the tongues and the edge 7a, 8a of that part of the guide 1 respectively facing the same. Moreover, the edges 7, 8 of the parts 2, 3 of the guide 1 have a curvature, which can have a constant radius or, advantageously, a radius varying continuously with the minimum value in the direction parallel to the tongues 9, 10.

The guide 1 of FIG. 3 has tongues at the free end having a rectangular shape in the plane of the drawing parallel to the surface of the magnetoresistive bar (not shown therein). It is also defined by the following parameters:

a: height of the lateral sides of the facing tongues, b: width of the tongues 9, 10 at their free end, t: distance separating the free front end 9c, 10c of the tongues from the edge 7a, 8a of the respectively opposite part of the guide 2, 3, w: distance separating the lateral sides 9a, 10a of two consecutive tongues 9, 10, Φ: distance separating the front part 9c, 10c of the tongues from the edge 7a, 8a of the part of the guide facing the tongue, Φ being a function of an angle θ varying between 0 and π/2.

t≧Φ and Φ is a rising function of θ with Φ (0)=w and Φ(π/2)=t.

Figure 4:
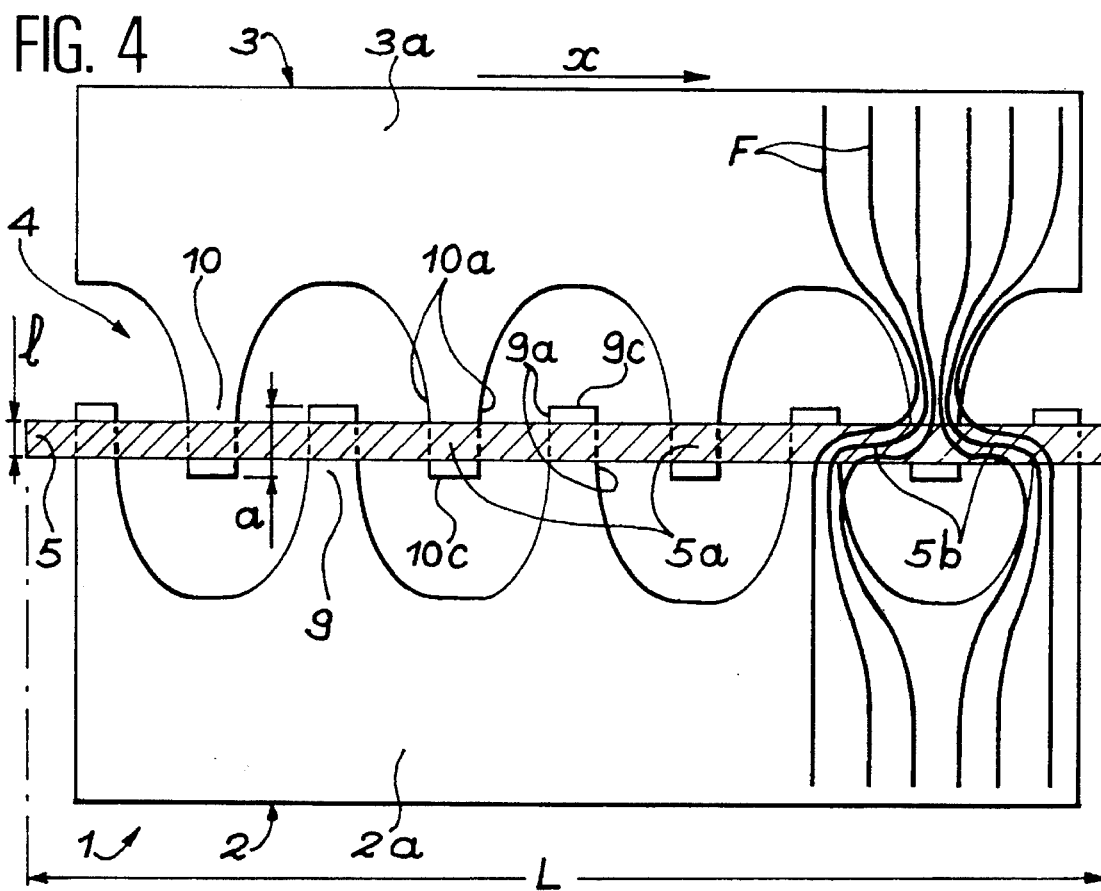
FIG. 4 in plan view the flux guide of FIG. 3 associated with a magnetoresistive bar accentuating the deviation of the field lines.

As shown in large scale in FIG. 4, the magnetoresistive bar 5 is positioned facing the head gap 4 and is superimposed, at least partly, on the end of the tongues 9, 10. In the regions 5a covering the tongues 9, 10, the bar 5 is not polarized by the magnetic field to be measured. However and as illustrated in the drawing, in the regions 5b not covering the tongues 9, 10 the field lines F penetrate the bar parallel to its length, which has the effect of greatly increasing its sensitivity. In the example of FIG. 4, the bar is placed above the flux guide, but could also be positioned beneath the guide.

The width l of the magnetoresistive bar 5 is equal to or less than "a" and the length L measured in direction x is at least equal to that of the guide.

On comparing the field lines F of FIG. 3 with those of FIG. 4, it can be seen that the magnetoresistive bar 5 significantly contributes to the deviation of the field lines in the bar length.

In the case where a magnetically and electrically insulating material layer separates the guide from the bar 5 and when said layer is thick and/or if the permeability of the bar 5 is low, the field lines F are less well detected by the bar and are therefore less deviated.

Figure 5:
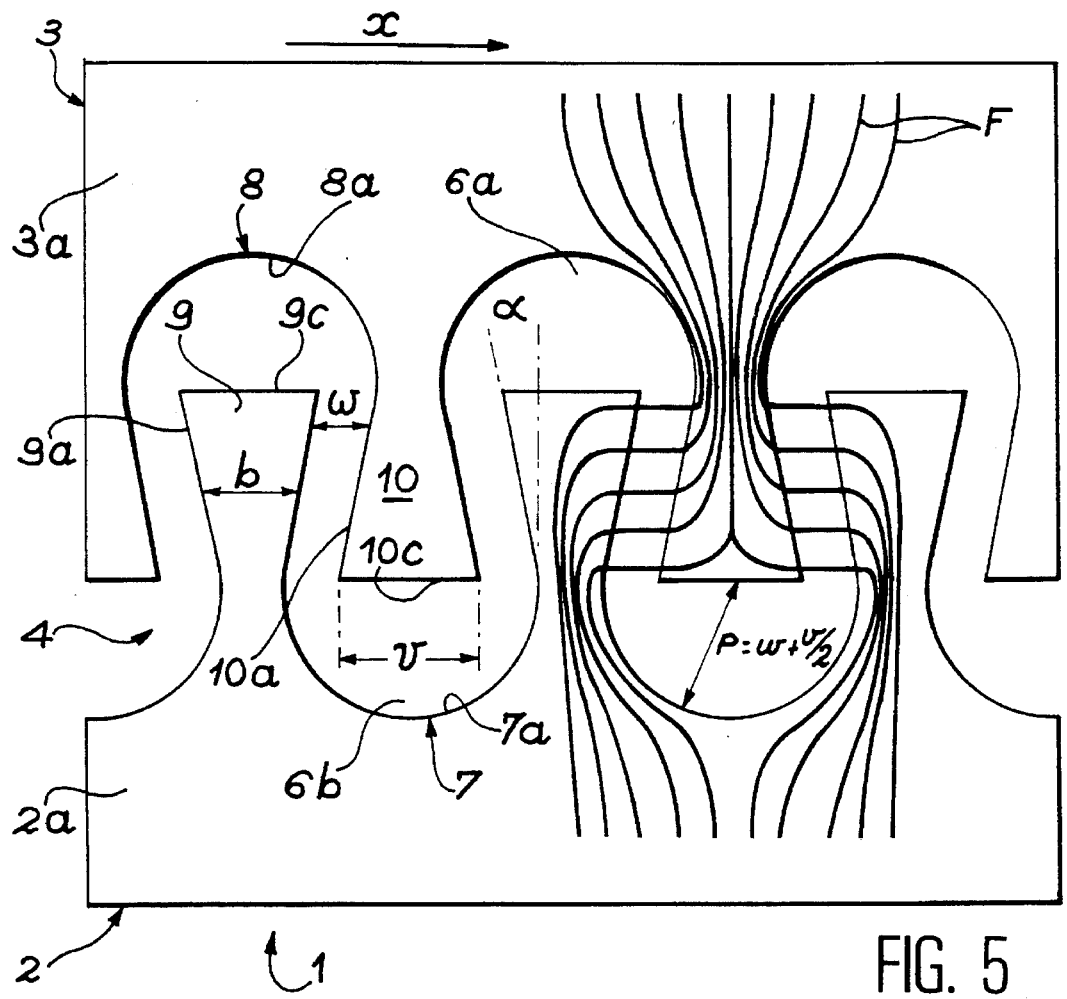
FIG. 5 in plan view a second variant of the flux guide.

In order to obviate this problem, another flux guide shape like that shown e.g. in FIG. 5 makes it possible to bring about a greater deviation of the field lines. In FIG. 5, the free end of the tongues 9, 10 has a trapezoidal shape in the plane of the drawing, parallel to the surface of the bar and the tongues are connected to a solid part 2a, 3a of the guide 1 by their small base.

The parameter b designates the half-intensity width of the trapezoidal portions of the tongues, v the width of the front end 9c, 10c of the tongues, constituted by the large base of the trapezium and w the distance between the lateral sides 9a, 10a of two consecutive tongues. The edge 7, 8 of the parts 2, 3 of the guide 1 has along the spaces 6a, 6b a circular arc curvature of radius P=w+v/2 and centred in the middle of the front portion 9c, 10c of the tongues 9, 10.

As can be seen in the drawing and even in the absence of the magnetoresistive bar, the field lines F are deviated until they reach a distance parallel to x.

The deviation of the field lines F is adjusted by acting on a parameter ∝ defined as being the angle between each lateral side 9a, 10a of the tongues 9, 10 and the perpendicular to x.

Figure 6:
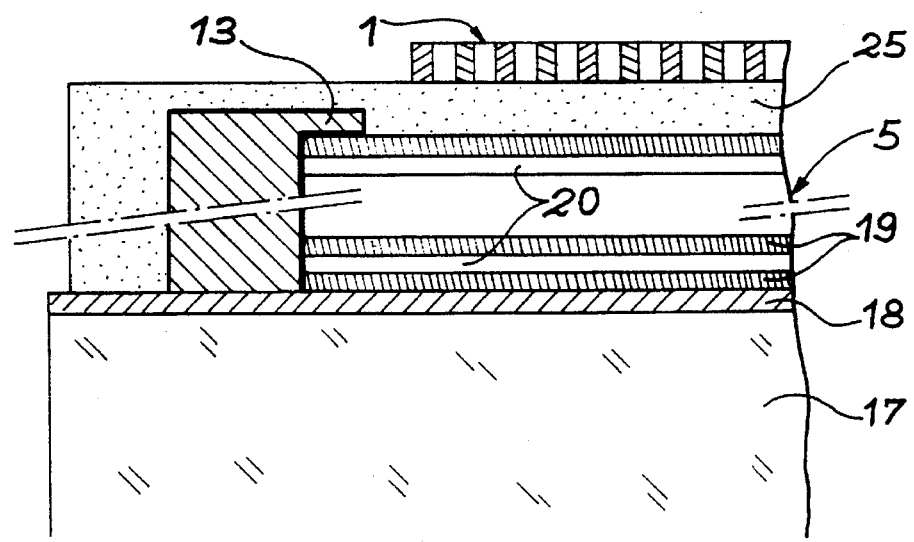
FIG. 6 in a larger-scale, partial section the component according to the invention.

FIG. 6 illustrates a special embodiment of the transducer and the different material layers used. In FIG. 6, the thickness of the layers is exaggerated in order to facilitate understanding.

A thin metal layer 18 with a thickness of a few dozen nanometers and made from iron or copper can in certain cases cover the e.g. Kapton, silica or glass substrate 17.

The bar is formed on the thin metal layer 18 in a succession of magnetic layers 19 of iron and nickel alloy or iron, nickel and cobalt alloy, separated by non-magnetic copper or silver layers. A magnetically and electrically insulating layer 25 (silica) separates the bar 5 from the flux guide 1.

The material chosen as the flux guide is a soft magnetic material, e.g. an alloy based on iron and nickel or a metallic multilayer magnetic structure.

The lead 13 is connected on a lateral side and on the top of the bar, but it is also possible to only connect the leads to the top of the bar.

The different operations for producing the transducer can be gathered from FIGS. 7A to 7F.

Firstly (FIG. 7A), it is possible to deposit by cathodic sputtering on the substrate 17 the metal layer 18, followed by a multilayer magnetoresistive structure constituted by alternate magnetic and non-magnetic layers. By means of a suitable mask and known photolithography processes etching takes place by ionic machining of the multilayer structure in order to form the bar 5.

Figure 7A:
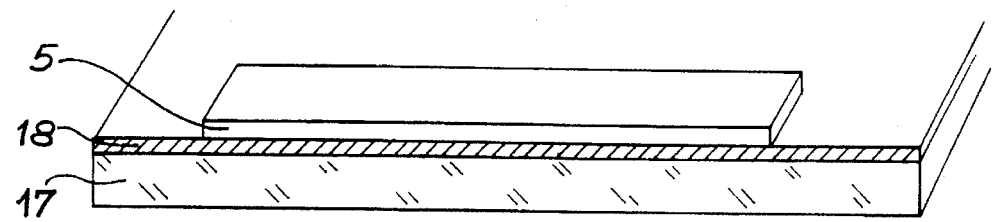
FIGS. 7A to 7E in longitudinal section, the successive phases of an example of producing the component according to the invention.
Figure 7B:
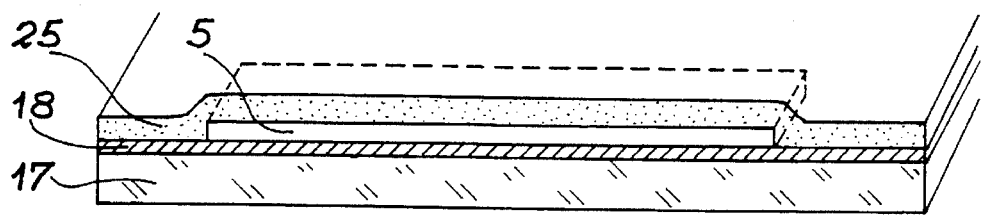
Figure 7C:
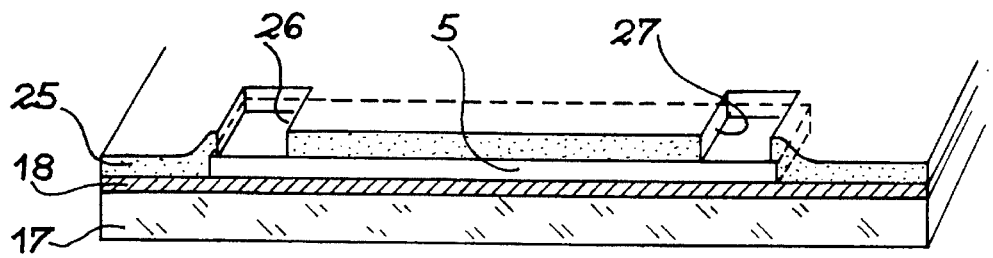
Figure 7D:
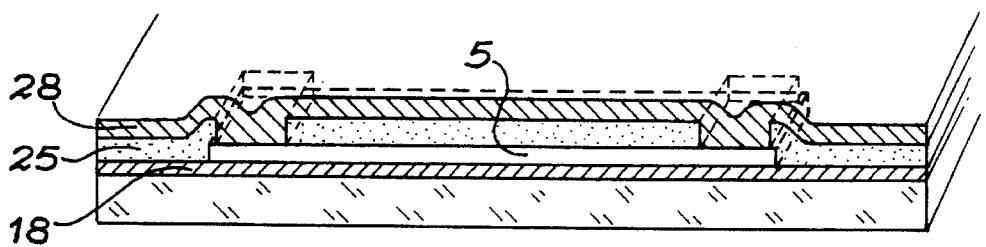

In the manner shown in FIG. 7B, the assembly is covered with a first silica insulating layer 25. Openings 26, 27 are made in the layer 25 at the ends of the bar 5 (FIG. 7C) and a conductive layer 28, e.g. of tungsten is deposited in order to form contacts on the bar ends (FIG. 7D). The conductive layer 28 is etched in order to form the leads 13, 14.

A second insulating layer 29 is deposited on the assembly before depositing another magnetic layer 30. This soft magnetic layer is etched to form the flux guide 1 (FIG. 7E).

Figure 7E:
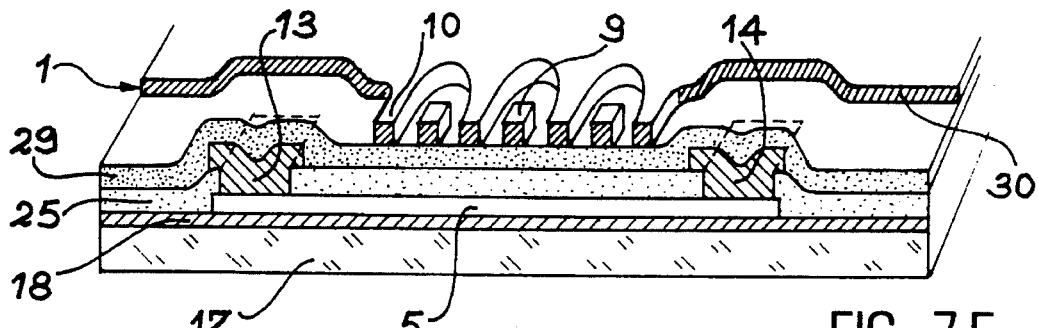

For reasons of clarity, the number of tongues of the flux guide shown in FIG. 7E has been reduced. For example, the flux guide can have a thickness of 0.5 μm.

Not shown power points are also produced on the leads.

According to a not shown variant, the flux guide is formed before the magnetoresistive bar, an electrically and magnetically insulating layer also separating the flux guide from the magnetoresistive bar.

The magnetoresistive component according to the invention is more particularly intended for producing a magnetic reading head with vertical or horizontal reading. It can be associated with an electrical recording winding so as to perform both reading and recording functions.

We claim:

1. Magnetoresistive magnetic field transducer comprising a magnetic flux guide (1) having first and second parts (2, 3) longitudinally separated by a head gap (4) and a magnetoresistive bar (5) placed facing and along the head gap (4) of the guide and formed from a stack of magnetic material layers separated by non-magnetic material layers, said first and second parts (2, 3) of the guide respectively having first and second series of tongues (9, 10) separated by spaces and contiguous with the headline, the tongues (9) of the first part (2) extending into the spaces of the second part (3) and the tongues of the second part extending into the spaces of the first part, the magnetoresistive bar (5) having a magnetoresistive effect when an external magnetic field to be measured has the same direction as the length of the bar.

2. Magnetoresistive transducer according to claim 1, wherein said magnetoresistive bar (5) is at least partly superimposed on the tongues (9, 10) of the first and second series of tongues.

3. Magnetoresistive transducer according to claim 1, wherein each of said tongues (9, 10) have lateral sides (9a, 10a) and a front portion (9c, 10c), the head gap having a smaller size in regions (r) between the lateral sides (9a, 10a) respectively of two consecutive tongues of the first and second series than in regions (R) between the front portions (9c, 10c) of the tongues and the part of the guide respectively facing the same.

4. Magnetoresistive transducer according to claim 1, wherein a distance (o) separating a front portion (9c, 10c) of the tongues (9, 10) from the part of the guide respectively facing the tongues (9, 10) varies continuously with a maximum value in a direction parallel to the tongues (9, 10).

5. Magnetoresistive transducer according to claim 1, wherein said tongues (9, 10) are trapezoidal in a plane parallel to a surface of the bar (5) facing the head gap and connected to a solid part of the guide (2a, 3a) by their small base.

6. Magnetoresistive transducer according to claim 1, wherein said tongues (9, 10) have a rectangular end in a plane parallel to a surface of the bar (5) facing the head gap.

7. Magnetoresistive transducer according to claim 1, wherein said first and second parts of the guide have a curvature along the spaces (6a, 6b) between the tongues (9, 10).

8. Magnetoresistive transducer according to claim 1, wherein said bar and/or flux guide are produced in thin film form.

9. Magnetoresistive transducer according to claim 8, wherein said magnetic material layers are chosen from an iron and nickel alloy and an iron, nickel and cobalt alloy.

10. Magnetoresistive transducer according to claim 8, wherein said non-magnetic material layers are chosen from among copper and silver.

11. Magnetoresistive transducer according to claim 8, wherein an electrically and magnetically insulating layer is provided for insulating the flux guide from the magnetoresistive bar.

12. Magnetoresistive transducer according to claim 1, wherein said flux guide is formed from a metallic multilayer magnetic structure.

13. Magnetic flux guide comprising first and second portions (2, 3) longitudinally separated by a head gap (4), said first and second portions (2, 3) respectively having first and second series (9, 10) of tongues separated by spaces and contiguous with the head gap, the tongues (9) of the first portion (2) extending into the spaces of the second portion (3) and the tongues of the second portion extending into the spaces of the first portion.

14. Magnetic flux guide according to claim 13, wherein each of said tongues (9, 10) have lateral sides (9a, 10a) and a front portion (9c, 10c), the head gap having a smaller size in regions (r) between the lateral sides (9a, 10a) respectively of two consecutive tongues of the first and second series than in regions (R) between the front portions (9c, 10c) of the tongues and the portion of the guide respectively facing them.

* * * * *

UNITED STATES PATENT AND TRADEMARK OFFICE
CERTIFICATE OF CORRECTION

PATENT NO. : 5,523,687
DATED : June 4, 1996
INVENTOR(S) : Mouchot et al.

It is certified that error appears in the above-indentified patent and that said Letters Patent is hereby corrected as shown below:

On the title page, item [57], in the Abstract, line 2, after "A" insert --magnetoresistive--.

Column 7, line 64 (Claim 1, line 9), delete "headline," and insert --head gap,--.

Signed and Sealed this

Third Day of December, 1996

Attest:

BRUCE LEHMAN

*Attesting Officer*  Commissioner of Patents and Trademarks